(12) United States Patent
Lu et al.

(10) Patent No.: US 9,698,028 B2
(45) Date of Patent: Jul. 4, 2017

(54) SEMICONDUCTOR PACKAGE AND METHOD OF MANUFACTURING THE SAME

(71) Applicant: Taiwan Semiconductor Manufacturing Company, Ltd., Hsin-Chu (TW)

(72) Inventors: Wen-Hsiung Lu, Jhonghe (TW); Ming-Da Cheng, Jhubei (TW); Yi-Wen Wu, Xizhi (TW); Yu-Peng Tsai, Taipei (TW); Chia-Wei Tu, Chunan town (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/799,284

(22) Filed: Jul. 14, 2015

(65) Prior Publication Data
US 2015/0318252 A1 Nov. 5, 2015

Related U.S. Application Data

(63) Continuation of application No. 13/594,544, filed on Aug. 24, 2012, now Pat. No. 9,082,776.

(51) Int. Cl.
*H01L 21/768* (2006.01)
*H01L 21/56* (2006.01)
(Continued)

(52) U.S. Cl.
CPC ............ *H01L 21/56* (2013.01); *H01L 21/566* (2013.01); *H01L 23/293* (2013.01); *H01L 23/3171* (2013.01); *H01L 23/3192* (2013.01); *H01L 24/03* (2013.01); *H01L 24/05* (2013.01); *H01L 24/11* (2013.01); *H01L 24/13* (2013.01); *H01L 2224/0391* (2013.01);
(Continued)

(58) Field of Classification Search
CPC ..... H01L 21/56; H01L 21/566; H01L 23/293; H01L 23/3171; H01L 23/3192; H01L 24/03; H01L 24/05; H01L 24/11; H01L 24/13
See application file for complete search history.

(56) References Cited

U.S. PATENT DOCUMENTS

| 5,072,520 A | 12/1991 | Nelson |
| 5,317,801 A | 6/1994 | Tamala et al. |

(Continued)

FOREIGN PATENT DOCUMENTS

| DE | 102005040213 A1 | 3/2006 |
| DE | 112005001949 T5 | 5/2007 |

(Continued)

*Primary Examiner* — Whitney T Moore
*Assistant Examiner* — Joseph Galvin, III
(74) *Attorney, Agent, or Firm* — Slater Matsil, LLP

(57) ABSTRACT

A semiconductor package includes a semiconductor substrate, a contact pad overlying the semiconductor substrate, an interconnect layer overlying the contact pad, a passivation layer formed between the contact pad and the interconnect layer, a bump overlying the interconnect layer, and a protection layer overlying the interconnect layer and the passivation layer and covering a lower portion of the bump. The protection layer includes a curved surface region.

20 Claims, 6 Drawing Sheets

(51) Int. Cl.
  *H01L 23/31* (2006.01)
  *H01L 23/00* (2006.01)
  *H01L 23/29* (2006.01)

(52) U.S. Cl.
  CPC ............ *H01L 2224/0401* (2013.01); *H01L 2224/05005* (2013.01); *H01L 2224/05022* (2013.01); *H01L 2224/05027* (2013.01); *H01L 2224/05083* (2013.01); *H01L 2224/05124* (2013.01); *H01L 2224/05147* (2013.01); *H01L 2224/05541* (2013.01); *H01L 2224/05556* (2013.01); *H01L 2224/05558* (2013.01); *H01L 2224/05567* (2013.01); *H01L 2224/05572* (2013.01); *H01L 2224/05611* (2013.01); *H01L 2224/05644* (2013.01); *H01L 2224/05655* (2013.01); *H01L 2224/05666* (2013.01); *H01L 2224/05681* (2013.01); *H01L 2224/05686* (2013.01); *H01L 2224/10126* (2013.01); *H01L 2224/1191* (2013.01); *H01L 2224/11831* (2013.01); *H01L 2224/131* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16* (2013.01); *H01L 2924/00014* (2013.01); *H01L 2924/12042* (2013.01); *H01L 2924/181* (2013.01)

(56) References Cited

U.S. PATENT DOCUMENTS

| | | | |
|---|---|---|---|
| 5,869,904 | A | 2/1999 | Shoji |
| 6,037,065 | A | 3/2000 | Hajmrle et al. |
| 6,158,644 | A | 12/2000 | Brofman et al. |
| 6,187,615 | B1 | 2/2001 | Kim et al. |
| 6,365,978 | B1 | 4/2002 | Ibnabdeljalil et al. |
| 6,369,451 | B2 | 4/2002 | Lin |
| 6,425,516 | B1 | 7/2002 | Iwatsu et al. |
| 6,586,322 | B1 | 7/2003 | Chiu et al. |
| 6,643,923 | B1 | 11/2003 | Hishinuma et al. |
| 6,664,637 | B2 | 12/2003 | Jimarez et al. |
| 6,933,613 | B2 | 8/2005 | Akashi |
| 6,940,169 | B2 | 9/2005 | Jin et al. |
| 7,187,068 | B2 | 3/2007 | Suh et al. |
| 7,372,151 | B1 | 5/2008 | Fan et al. |
| 7,749,882 | B2 | 7/2010 | Kweon et al. |
| 7,977,783 | B1 | 7/2011 | Park et al. |
| 8,264,089 | B2 | 9/2012 | Alvarado et al. |
| 8,345,435 | B2 | 1/2013 | Hamatani et al. |
| 8,362,612 | B1 | 1/2013 | Paek et al. |
| 8,624,392 | B2 | 1/2014 | Yew et al. |
| 8,735,273 | B2 | 5/2014 | Lu et al. |
| 9,437,564 | B2 | 9/2016 | Lu et al. |
| 2001/0050434 | A1 | 12/2001 | Kaneda et al. |
| 2002/0001937 | A1 | 1/2002 | Kikuchi et al. |
| 2002/0031868 | A1 | 3/2002 | Capote et al. |
| 2002/0167077 | A1 | 11/2002 | Vincent |
| 2003/0068847 | A1 | 4/2003 | Watanabe et al. |
| 2003/0096453 | A1 | 5/2003 | Wang et al. |
| 2003/0153172 | A1 | 8/2003 | Yajima et al. |
| 2004/0012930 | A1 | 1/2004 | Grigg |
| 2004/0027788 | A1 | 2/2004 | Chiu et al. |
| 2004/0072387 | A1 | 4/2004 | Hong et al. |
| 2004/0266162 | A1 | 12/2004 | Feng |
| 2005/0080956 | A1 | 4/2005 | Zaudtke et al. |
| 2006/0038291 | A1* | 2/2006 | Chung ............ H01L 23/3128 257/738 |
| 2006/0063378 | A1 | 3/2006 | Lin et al. |
| 2006/0189114 | A1 | 8/2006 | Seto et al. |
| 2007/0045840 | A1 | 3/2007 | Varnau |
| 2007/0102815 | A1 | 5/2007 | Kaufmann et al. |
| 2007/0108573 | A1 | 5/2007 | Chung et al. |
| 2007/0176290 | A1 | 8/2007 | Park et al. |
| 2007/0184577 | A1 | 8/2007 | Chung et al. |
| 2007/0187825 | A1 | 8/2007 | Hashimoto |
| 2007/0267745 | A1 | 11/2007 | Chao et al. |
| 2008/0001290 | A1 | 1/2008 | Chou et al. |
| 2008/0150134 | A1 | 6/2008 | Shinkai et al. |
| 2008/0308935 | A1 | 12/2008 | Kim et al. |
| 2009/0020864 | A1 | 1/2009 | Pu et al. |
| 2009/0045513 | A1 | 2/2009 | Kim et al. |
| 2009/0052218 | A1 | 2/2009 | Kang |
| 2009/0120215 | A1 | 5/2009 | Jacobson et al. |
| 2009/0130840 | A1 | 5/2009 | Wang et al. |
| 2009/0140442 | A1 | 6/2009 | Lin |
| 2009/0146317 | A1 | 6/2009 | Shih |
| 2009/0206479 | A1 | 8/2009 | Daubenspeck et al. |
| 2009/0314519 | A1 | 12/2009 | Soto et al. |
| 2010/0065966 | A1 | 3/2010 | Pendse et al. |
| 2010/0078772 | A1 | 4/2010 | Robinson |
| 2010/0096754 | A1* | 4/2010 | Lee ............ H01L 21/568 257/738 |
| 2010/0140760 | A1 | 6/2010 | Tam et al. |
| 2011/0037158 | A1 | 2/2011 | Youn et al. |
| 2011/0080713 | A1 | 4/2011 | Sunohara |
| 2011/0101520 | A1* | 5/2011 | Liu ............ H01L 23/48 257/737 |
| 2011/0108983 | A1 | 5/2011 | Lu et al. |
| 2011/0278739 | A1 | 11/2011 | Lai et al. |
| 2011/0285008 | A1 | 11/2011 | Nakano |
| 2012/0006592 | A1 | 1/2012 | Ouchi et al. |
| 2012/0199959 | A1 | 8/2012 | Hart |
| 2012/0199991 | A1 | 8/2012 | Okamoto et al. |
| 2012/0261817 | A1 | 10/2012 | Do et al. |
| 2013/0009307 | A1 | 1/2013 | Lu et al. |
| 2013/0105971 | A1 | 5/2013 | Daubenspeck et al. |
| 2013/0147031 | A1 | 6/2013 | Chen et al. |
| 2013/0168850 | A1 | 7/2013 | Samoilov et al. |
| 2013/0181338 | A1* | 7/2013 | Lu ............ H01L 23/3157 257/737 |
| 2014/0077361 | A1 | 3/2014 | Lin et al. |
| 2014/0159223 | A1 | 6/2014 | Chen et al. |
| 2014/0175639 | A1 | 6/2014 | Kim et al. |
| 2014/0187103 | A1 | 7/2014 | Chen et al. |
| 2014/0231125 | A1 | 8/2014 | Chen et al. |
| 2014/0232017 | A1 | 8/2014 | Rampley et al. |
| 2014/0252601 | A1 | 9/2014 | Lu et al. |
| 2014/0256092 | A1 | 9/2014 | Kuo et al. |
| 2014/0264846 | A1 | 9/2014 | Chen et al. |
| 2015/0123269 | A1 | 5/2015 | Chen et al. |
| 2015/0137352 | A1 | 5/2015 | Chen et al. |
| 2015/0214145 | A1 | 7/2015 | Lu et al. |
| 2015/0235977 | A1 | 8/2015 | Shao et al. |
| 2015/0243613 | A1 | 8/2015 | Chen et al. |
| 2015/0249066 | A1 | 9/2015 | Lin et al. |
| 2015/0262948 | A1 | 9/2015 | Lu et al. |
| 2016/0133482 | A1 | 5/2016 | Chen et al. |
| 2016/0218090 | A1 | 7/2016 | Yu et al. |

FOREIGN PATENT DOCUMENTS

| | | |
|---|---|---|
| KR | 1020070076846 A | 7/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

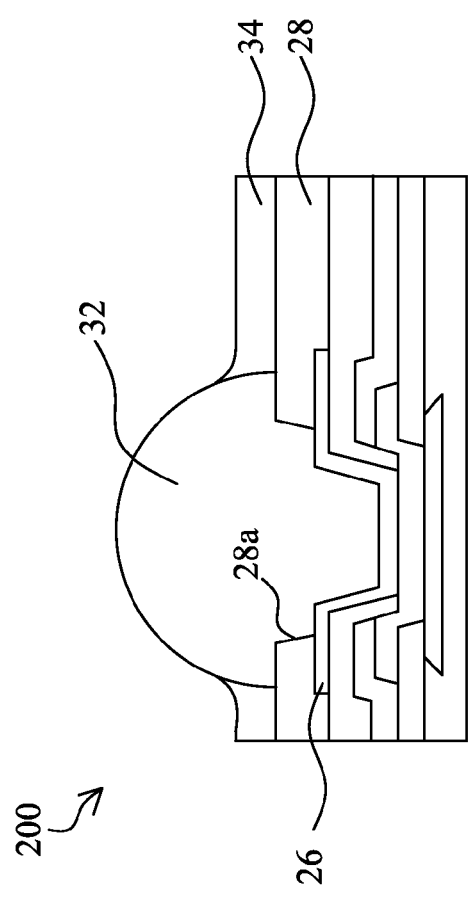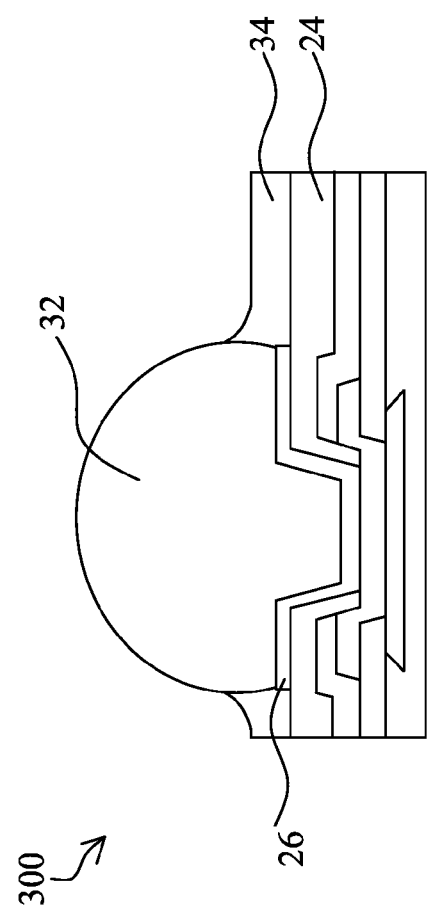

SEMICONDUCTOR PACKAGE AND METHOD OF MANUFACTURING THE SAME

This application is a continuation of U.S. patent application Ser. No. 13/594,544, filed on Aug. 24, 2012, entitled "Semiconductor Package and Method of Manufacturing the Same," which application is hereby incorporated herein by reference in its entirety.

TECHNICAL FIELD

The disclosure relates to semiconductor packages and methods of manufacturing the same.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump actually contains the bump itself and an "under bump metallurgy" (UBM) located between the bump and an I/O pad. Wafer level chip scale packaging (WLCSP) is currently widely used for its low cost and relatively simple processes, and ball placement or ball drop process is utilized in the WLCSP technology.

DESCRIPTION OF THE DRAWINGS

FIG. 8 is a cross-sectional view of a semiconductor package according to still another embodiment;

FIG. 9 is a cross-sectional view of a semiconductor package according to still another embodiment.

DETAILED DESCRIPTION

Figure 1:
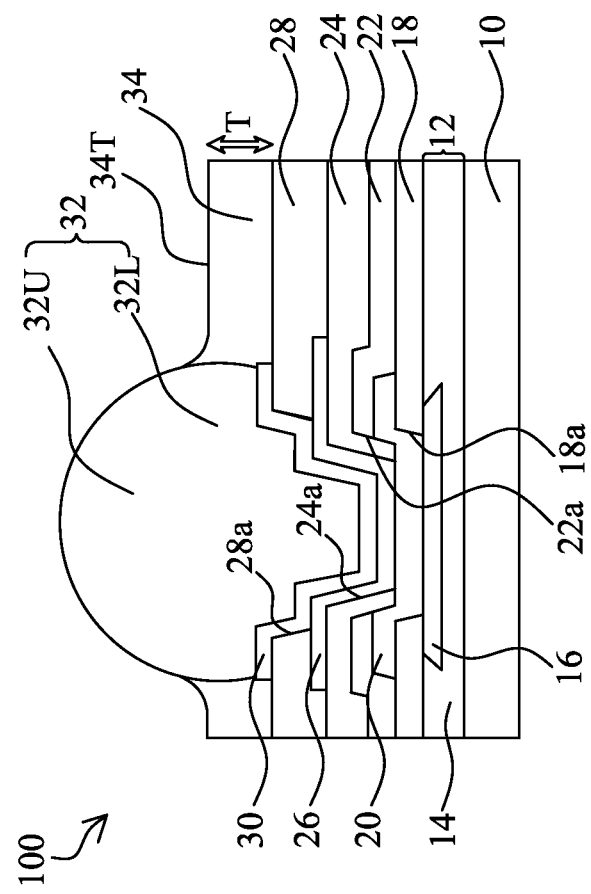
FIG. 1 is a cross-sectional view of a semiconductor package according to an embodiment.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIG. 1 is a cross-sectional view of a semiconductor package according to an embodiment.

Referring to FIG. 1, a semiconductor package 100 includes a semiconductor substrate 10 on which an interconnect structure 12, passivation layers 18 and 22, buffer layers 24 and 28 and a protection layer 34 are successfully formed. The semiconductor package 100 also includes a contact pad 20, a post-passivation interconnect (PPI) layer 26, an under-bump metallization (UBM) layer 30, and a bump 32 successfully formed on and electrically connected to the interconnect structure 12.

The semiconductor substrate 10 may comprise, for example, bulk silicon, doped or undoped, or an active layer of a semiconductor-on-insulator (SOI) substrate. The semiconductor substrate 10 may be provided as a wafer level scale or a chip level scale. Other substrates, such as a multi-layered or gradient substrate may also be used. The semiconductor substrate 10 may have electrical circuitry formed thereon. The electrical circuitry may be any type of circuitry suitable for a particular application. In some embodiments, the electrical circuitry includes various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The interconnect structure 20 is formed on the semiconductor substrate 10 to interconnect the electrical circuitry to each other and to provide an external electrical connection. The interconnect structure 20 includes one or more inter-metal dielectric (IMD) layers 14 and the associated metallization layers 16. In an embodiment, at least one of the IMD layers 14 is formed of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, one or more etch stop layers (not shown) may be positioned between adjacent ones of the IMD layers 14. In some embodiments, at least one of the metallization layers 16 is formed of copper or copper alloys, or of other metals. As depicted in FIG. 1, the metallization layer 16 is a top metal layer 16a formed and patterned in or on an uppermost IMD layer 14 to provide external electrical connections, in accordance with an embodiment. In some embodiments, the uppermost IMD layer is formed of a dielectric material, such as silicon nitride, silicon oxide, undoped silicon glass, and the like.

The passivation layers formed and patterned on the interconnect structure 12 includes a first passivation layer 18 and a second passivation layer 22. In an embodiment, the first passivation layer 18 is formed on the interconnect structure 12 and then patterned to form a first opening 18a that exposes a portion of the top metal layer 16. The first passivation layer 18 may be formed of a dielectric material, for example, silicon nitride, silicon oxide, undoped silicate glass, silicon oxynitride, or a non-porous material by any suitable method, such as CVD, PVD, or the like.

The contact pad 20 is formed in the first opening 18a of the first passivation layer 18 to electrically connect the top metal layer 16a. In an embodiment, the contact pad 20 can extend onto the first passivation layer 18. In some embodiments, the contact pad 20 is formed of a conductive material, for example, aluminum, aluminum copper, aluminum alloys, copper, copper alloys, or the like.

The second passivation layer 22 is formed on the first passivation layer 18 and the contact pad 20, and then the second passivation layer 22 is patterned to form a second opening 22a that exposes a portion of the contact pad 20. In some embodiments, the second passivation layer 22 is formed of a dielectric material, such as undoped silicate glass (USG), silicon nitride, silicon oxide, silicon oxynitride or a non-porous material by any suitable method, such as CVD, PVD, or the like. In an embodiment, the second passivation layer 22 is formed and patterned to cover a peripheral portion of the contact pad 20, and to expose a central portion of the contact pad 20 through the second opening 22a. The first passivation layer 18 and the second passivation layer 22 may be a single layer or a laminated layer. In FIG. 1, a single layer of the first passivation layer 18 and a single layer of the second passivation layer 22 are shown for illustrative purposes only. As such, other embodiments may include any number of passivation layers. In an embodiment shown in FIG. 1, the second opening 22a is less than the first opening 18a. In other embodiments, the second opening 22a is equal to or greater than the first opening 18a.

The first buffer layer 24 is formed on the second passivation layer 22 and the contact pad 20, and then the first buffer layer 24 is patterned to form a third opening 24a that exposes a portion of the contact pad 20. In an embodiment, the first buffer layer 24 is a polymer layer, for example, a polymer material such as an epoxy, polyimide, benzocyclobutene (BCB), polybenzoxazole (PBO), and the like. In an embodiment shown in FIG. 1, the third opening 24a is less than the second opening 22a. In other embodiments, the third opening 24a is equal to or greater than the second opening 22a.

The PPI layer 26 includes at least one metallization layer formed in the third opening 24a and electrically connected to the contact pad 20. In an embodiment, the PPI layer 26 is formed along the bottom and sidewalls of the third opening 24 to physically contact the exposed portion of the contact pad 20. In some embodiments, the PPI layer 26 formed in the third opening 24a extends to the top surface of the first buffer layer 24. The formation methods of the PPI layer 26 may include depositing, photoresist coating, lithography, wet or dry etching, and/or the like. In some embodiments, the PPI layer 26 includes copper, aluminum, copper alloy, or other mobile conductive materials using plating, electroless plating, sputtering, chemical vapor deposition methods, and the like. In some embodiments, the PPI layer 26 includes a copper layer or a copper alloy layer.

The second buffer layer 28 is formed on the first buffer layer 24 and the PPI layer 26, and then the second buffer layer 28 is patterned to form a fourth opening 28a that exposes a portion of the PPI layer 26. In an embodiment, the second buffer layer 28 is a polymer layer, for example, a polymer material such as an epoxy, polyimide, benzocyclobutene (BCB), polybenzoxazole (PBO), and the like. In an embodiment shown in FIG. 1, the fourth opening 28a is greater than the third opening 24a. In other embodiments, the fourth opening 28a is equal to or less than the third opening 24a.

The UBM layer 30 includes at least one metallization layer formed in the fourth opening 28a and electrically connected to the PPI layer 26. In an embodiment, the UBM layer 30 is formed along the bottom and sidewalls of the fourth opening 28a to physically contact the exposed portion of the PPI layer 26. In some embodiments, the UBM layer 30 formed in the fourth opening 28a extends to the top surface of the second buffer layer 28. The formation methods of the UBM layer 30 may include depositing, photoresist coating, lithography, wet or dry etching, and/or the like. In some embodiments, the UBM layer 30 includes at least one metallization layer comprising titanium (Ti), tantalum (Ta), titanium nitride (TiN), tantalum nitride (TaN), copper, copper alloys, nickel (Ni), tin (Sn), gold (Au), or combinations thereof. In some embodiments, the UBM layer 30 includes at least one Ti-containing layer and at least one Cu-containing layer.

The bump 32 is formed on the UBM layer 30 and positioned directly over the contact pad 16. In an embodiment, the bump 32 is formed of a conductive material including solder, Cu, Ni or Au. In some embodiments, the bump 32 is a solder bump which can be formed by attaching a solder ball to the UBM layer 30 or plating a solder material using photolithography technologies followed by reflow processes. In an embodiment, the solder bump has a diameter greater than about 200 µm. In some embodiments, the solder bump includes a lead-free pre-solder layer, SnAg, or a solder material including alloys of tin, lead, silver, copper, nickel, bismuth, or combinations thereof.

The protection layer 34 is applied on the second buffer layer 28, where the bump 32 is partially buried in the protection layer 34. In an embodiment, the protection layer 34 is in physical contact with a lower portion 32L of the bump 32, while an upper portion 32U of the bump 32 is exposed and protrudes from a top surface 34T of the protection layer 34. In some embodiments, a height of the lower portion 32L of the bump 32 is between about ¼ to ¾ of a total height of the bump 32. In some embodiments, the protection layer 34 is in physical contact with the second buffer layer 28 and/or the UBM layer 30. In an embodiment, the protection layer 34 is a molding compound layer. In some embodiments, the protection layer 34 is a polymer layer such as an epoxy, polyimide, benzocyclobutene (BCB), polybenzoxazole (PBO), and the like. The thickness T of the protection layer 34 is in a range between about 20 µm and about 120 µm in accordance with an embodiment. For example, the thickness T is about 60~80 µm, 80~100 µm, or 100~120 µm. In the semiconductor package 100, the bump 32 is positioned directly over the contact pad 20, and the protection layer 34 is applied around the bump 32. This can results in a robust package with better reliability performance and increased thermal fatigue lifetime, and has benefits of reducing cycle time for production and process costs compared with laser through molding via process for example.

Figure 2:
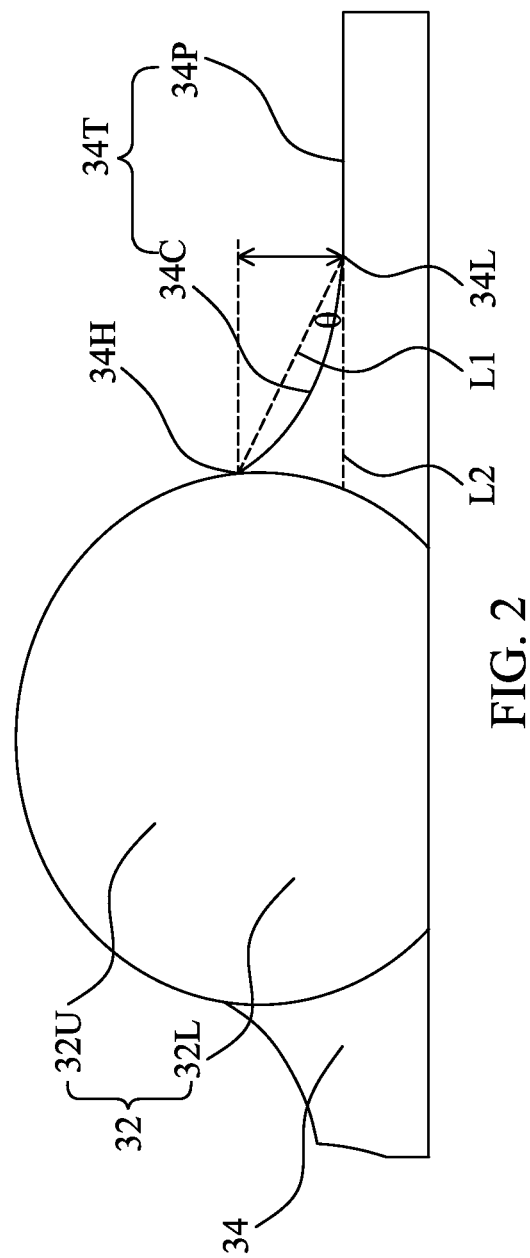
FIG. 2 is an enlarged view of the bump and the protection layer shown in FIG. 1.

FIG. 2 is an enlarged view of the bump and the protection layer shown in FIG. 1. In at least one embodiment, the top surface 34T of the protection layer 34 includes a curved surface region 34C around the bump 32. In another embodiment, the top surface 34T of the protection layer 34 further includes a planar surface region 34P adjacent to the curved surface region 34C, but the planar surface region 34P is not in physical contact with the bump 32. In still another embodiment, the top surface 34T of the protection layer 34 has a highest point 34H in physical contact with the bump 32 and a lowest point 34L, wherein a distance D between the two points 34H and 34L is between about 5 μm and about 40 μm, and an angle θ between a first line L1 (an inclined line between the highest point 34H and the lowest point 34L) and a second line L2 (a horizontal line) is between about 10 degrees and about 50 degrees. As used herein, horizontal a relative term, i.e., it is meant to imply the line is parallel to the major surface of the substrate. It is understood that horizontal is not intended to be in reference to some absolute reference, such as the surface of the Earth. In some embodiments, the distance D is less than the thickness T of the protection layer 34.

FIGS. 3-7 are cross-sectional views illustrating at various intermediate stages of forming the protection layer around the bump shown in FIG. 1 according to an embodiment.

Figure 3:
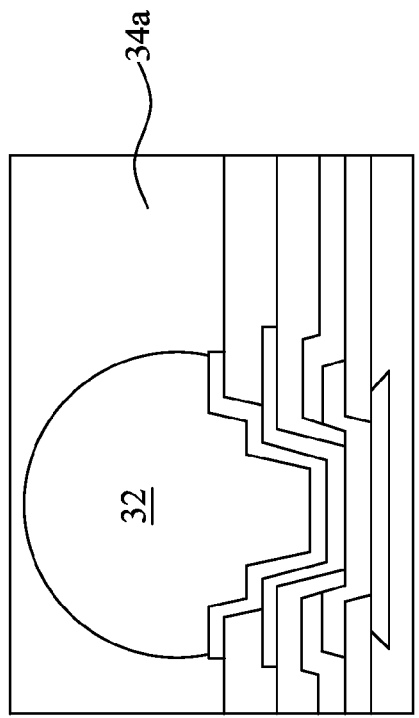
FIGS. 3-7 are cross-sectional views illustrating at various intermediate stages of forming the protection layer around the bump shown in FIG. 1 according to an embodiment.
Figure 5:
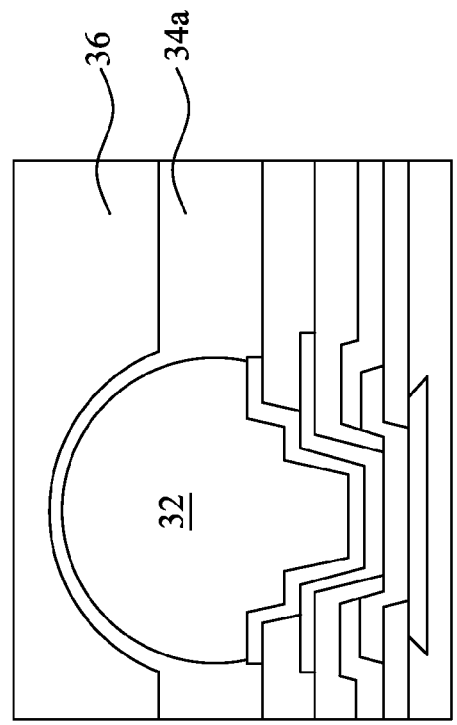
Figure 4:
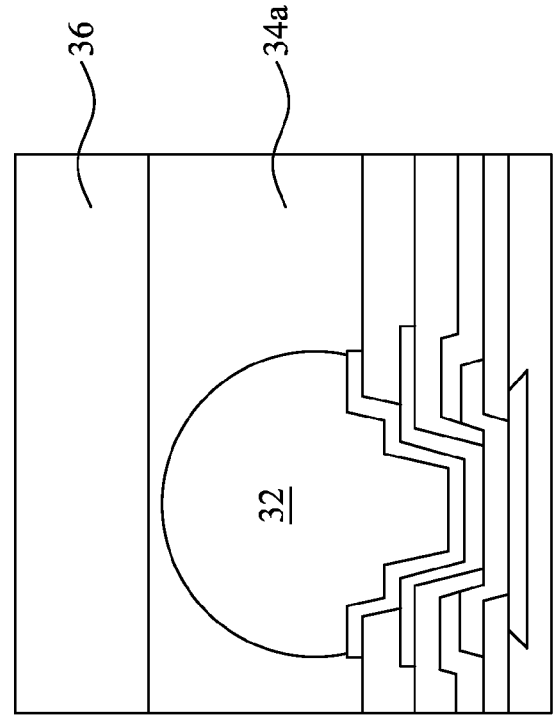
Figure 7:
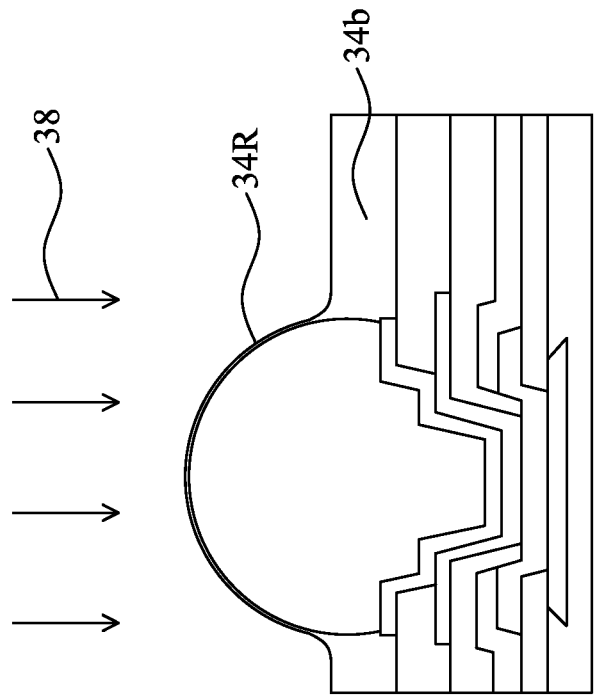
Figure 6:
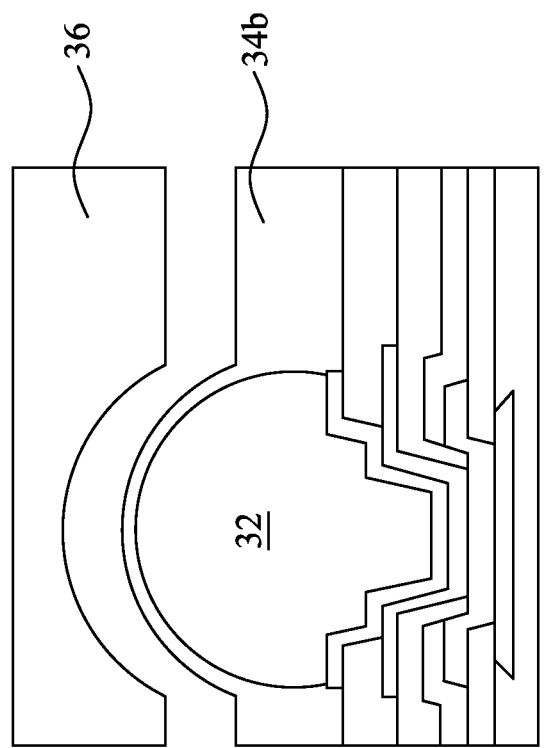

The formation of the protection layer 34 starts from the step shown in FIG. 3 wherein a liquid molding compound 34a is applied on the second buffer layer 28 and the bump 32. Next, referring to FIG. 4, in an embodiment a release film 36 or a soft material may be applied on the liquid molding compound 34a. Pressure is applied on the release film 36 on the liquid molding compound 34a, so that a portion of the bump 32 is pressed into release film 36 as shown in FIG. 5. Furthermore, the pressure applied on the release film 36 may push some of liquid molding compound downward. While the pressure is applied to the release film 36 pushing against the bump 32 and the liquid molding compound 34a, a curing may be performed to cure and solidify liquid molding compound 34a. Thereafter, as shown in FIG. 6, the release film 36 is peeled off the molding compound layer 34b, which is now in a solid form covering the lower portion 32L of the bump 32 in the resulting structure. In order to remove residues of the molding compound layer 34b, an etch step 38 is performed as depicted in FIG. 7. In some embodiments, after the etch step 38, the residue 34R of the molding compound layer 34b remaining on the bump 32 has a thickness less than about 1 μm.

FIG. 8 is a cross-sectional view of a semiconductor package 200 according to still another embodiment. The explanation of the same or similar portions to the description in FIG. 1 will be omitted. In the semiconductor package 200, the bump 32 is formed in the fourth opening 28a and in physical contact with the exposed portion of the PPI layer 26, without forming the UBM layer 30 shown in FIG. 1. In an embodiment, the bump 32 fills the fourth opening 28a and extends to the top surface of the second buffer layer 28.

FIG. 9 is a cross-sectional view of a semiconductor package 300 according to still another embodiment. The explanation of the same or similar portions to the description in FIG. 1 will be omitted. In the semiconductor package 300, the bump 32 is formed on the exposed portion of the PPI layer 26, while the formation of the second buffer layer 28 and the UBM layer 30 shown in FIG. 1 are omitted. Thus, the protection layer 34 is formed on the first protection layer 24 to surround the lower portion 32L of the bump 32. In an embodiment, the protection layer 34 is in physical contact with the PPI layer 26. The semiconductor package 300 can achieve a smaller form factor and have benefits of reducing manufacture cycle time and process costs.

Figure 10:
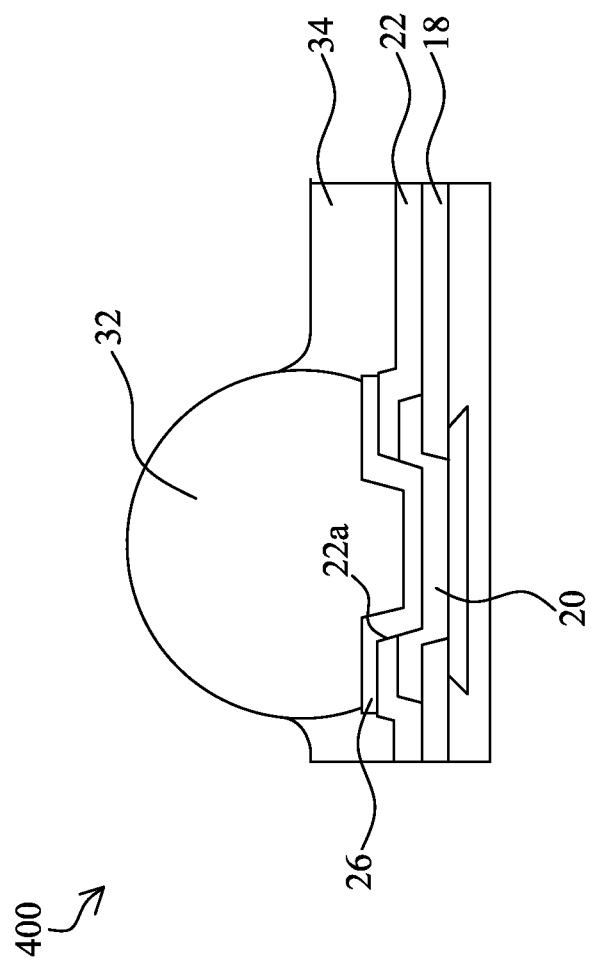
FIG. 10 is a cross-sectional view of a semiconductor package according to still another embodiment.

FIG. 10 is a cross-sectional view of a semiconductor package 400 according to still another embodiment. The explanation of the same or similar portions to the description in FIG. 1 will be omitted. In the semiconductor package 400, the formation of the first buffer layer 24, the second buffer layer 28 and the UBM layer 30 shown in FIG. 1 are omitted, and therefore the PPI layer 26 is formed in the second opening 22a to physically contact the exposed portion of the contact pad 20 and the bump 32 is formed on the PPI layer 26. In an embodiment, the PPI layer 26 extends to the top surface of the second passivation layer 22, such that the PPI layer 26 is formed between the bump 32 and the second passivation layer 22. Thus, the protection layer 34 is formed on the second passivation layer 22 to surround the lower portion 32L of the bump 32. In an embodiment, the protection layer 34 is in physical contact with the PPI layer 26. The semiconductor package 300 can achieve a smaller form factor and have benefits of reducing manufacture cycle time and process costs.

According to some embodiments, a package includes a semiconductor substrate, a contact pad overlying the semiconductor substrate, an interconnect layer overlying the contact pad, a passivation layer formed between the contact pad and the interconnect layer, a bump overlying the interconnect layer, and a protection layer overlying the interconnect layer and the passivation layer and covering a lower portion of the bump. The protection layer includes a curved surface region.

According to some embodiments, a semiconductor package includes a semiconductor substrate, a contact pad overlying the semiconductor substrate, an interconnect layer overlying the contact pad, a passivation layer formed between the contact pad and the interconnect layer, a bump overlying the interconnect layer, and a molding compound layer overlying the interconnect layer and the passivation layer and covering a lower portion of the bump. The top surface of the molding compound layer includes a curved surface region and a planar surface region. The curved surface region is positioned between the bump and the planar surface region.

According to some embodiments, a semiconductor package includes a semiconductor substrate, a contact pad overlying the semiconductor substrate, an interconnect layer overlying the contact pad, a passivation layer formed between the contact pad and the interconnect layer, a bump overlying the interconnect layer, and a protection layer overlying the interconnect layer and the passivation layer and covering a lower portion of the bump. The protection layer includes a curved surface region around the lower portion of the bump. A distance between a lowest point and a highest point of the protection layer is less than a thickness of the protection layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A structure comprising:
   a contact pad over a substrate;
   a passivation layer over the substrate, the passivation layer extending over at least a portion of a top surface of the contact pad;
   a first buffer layer over the passivation layer;
   a post-passivation interconnect extending over the first buffer layer and extending through an opening in the first buffer layer to contact the contact pad;
   an under-bump metallization layer over and coupled to the post-passivation interconnect;
   a solder bump over and coupled to the under-bump metallization layer, a portion of the solder bump extending into the opening in the first buffer layer; and
   a protection layer over the post-passivation interconnect and the first buffer layer, the protection layer surrounding a lower portion of the solder bump.

2. The structure claim 1 further comprising:
   a second buffer layer between the protection layer and the first buffer layer.

3. The structure of claim 2, wherein the first buffer layer comprises a polymer, and wherein the second buffer layer comprises a polymer.

4. The structure of claim 2, wherein at least a portion of the under-bump metallization layer extends over the second buffer layer.

5. The structure of claim 1 further comprising:
   a dielectric layer between the substrate and at least a portion of the contact pad.

6. The structure of claim 1, wherein the protection layer comprises a curved surface region, wherein the curved surface region has a concave surface extending outwards from the solder bump.

7. The structure of claim 1, wherein a top surface of the protection layer comprises a lowest point and a highest point, and a distance between the lowest point and the highest point is between about 5 μm and about 40 μm.

8. The structure of claim 1, wherein the first buffer layer contacts a surface of the contact pad.

9. The structure of claim 1, wherein the first buffer layer has a bottommost surface that is lower than an uppermost surface of the contact pad.

10. A method comprising:
    forming a contact pad over a substrate;
    forming a passivation layer, including a first portion of the passivation layer over at least a portion of a top surface of the contact pad and over the substrate;
    forming a first buffer layer over the passivation layer, the first buffer layer having a first opening exposing a portion of the contact pad;
    forming a post-passivation interconnect over the first buffer layer and in the first opening in the first buffer layer to contact the contact pad;
    forming a solder bump over and coupled to the post-passivation interconnect, a portion of the solder bump extending into the first opening in the first buffer layer, wherein the solder bump is directly over the contact pad and the first portion of the passivation layer; and
    forming a protection layer over the post-passivation interconnect and the first buffer layer, the protection layer surrounding a lower portion of the solder bump.

11. The method of claim 10 further comprising:
    forming a second buffer layer between the protection layer and the first buffer layer, the second buffer layer having a second opening exposing a portion of the post-passivation interconnect.

12. The method of claim 11, wherein the first buffer layer comprises a polymer, and wherein the second buffer layer comprises a polymer.

13. The method of claim 11 further comprising:
    forming an under-bump metallization layer over the second buffer layer and in the second opening to contact the post-passivation interconnect.

14. The method of claim 10, wherein the forming the protective layer further comprises:
    covering the solder bump and the first buffer layer with a liquid molding compound;
    pressing down on a top surface of the liquid molding compound and curing the liquid molding compound so that a cured molding compound is formed, the cured molding compound having a top surface having a first planar region and having a second curved region, the second curved region conforming to the solder bump and positioned between the solder bump and the first planar region; and
    removing a portion of the second curved region to expose the solder bump, wherein the second curved region has a concave surface extending outwards from the solder bump.

15. The method of claim 14 wherein pressing down on a top surface of the liquid molding compound further comprises:
    forming a release film on the top surface of the liquid molding compound;
    applying pressure to the release film to push the liquid molding compound downward; and
    removing the release film after the liquid molding compound is cured.

16. The method of claim 14 wherein the removing the portion of the second curved region to expose the solder bump further comprises etching the cured molding compound.

17. The method of claim 10, wherein the first buffer layer contacts a surface of the contact pad.

18. A method comprising:
    forming a first passivation layer over a substrate;
    forming a first opening through the first passivation layer to expose a conductive feature in the substrate;
    forming a contact pad over the first passivation layer and in the first opening to contact the conductive feature;
    forming a second passivation layer over the contact pad;
    forming a second opening through the second passivation layer to expose a portion of the contact pad;
    forming a first buffer layer over the second passivation layer and in the second opening;
    forming a third opening through the first buffer layer to expose a portion of the contact pad;
    forming a post-passivation interconnect over the first buffer layer and in the third opening to contact the contact pad;
    forming a solder bump over and coupled to the post-passivation interconnect, a portion of the solder bump extending into the third opening in the first buffer layer; and
    forming a protection layer over the post-passivation interconnect and the first buffer layer, the protection layer surrounding a lower portion of the solder bump.

19. The method of claim 18 further comprising:
    forming a second buffer layer over the first buffer layer; and
    forming a fourth opening through the second buffer layer to expose a portion of the first buffer layer and a portion of the post-passivation interconnect, the solder bump extending into the fourth opening in the second buffer layer.

20. The method of claim 19 further comprising:

forming an under-bump metallization layer over the second buffer layer and in the fourth opening and the third opening to contact the post-passivation interconnect.

* * * * *